(12) United States Patent
Takata et al.

(10) Patent No.: US 6,605,779 B2
(45) Date of Patent: Aug. 12, 2003

(54) ELECTRONIC CONTROL UNIT

(75) Inventors: Hiroki Takata, Anjo (JP); Kenji Suzuki, Anjo (JP); Naoto Ogasawara, Anjo (JP); Toshio Nagata, Anjo (JP)

(73) Assignees: Aisin Aw Co., Ltd. (JP); Kyocera Corporation (JP)

( * ) Notice: Subject to any disclaimer, the term of this patent is extended or adjusted under 35 U.S.C. 154(b) by 0 days.

(21) Appl. No.: 09/971,357

(22) Filed: Oct. 5, 2001

(65) Prior Publication Data

US 2002/0079119 A1 Jun. 27, 2002

(30) Foreign Application Priority Data

Dec. 22, 2000 (JP) ........................................ 2000-391552

(51) Int. Cl.[7] ................................................. H05K 5/06
(52) U.S. Cl. ..................... 174/52.2; 361/757; 361/802; 257/783; 257/787; 257/788; 257/790
(58) Field of Search .............................. 174/52.2, 52.3, 174/250, 251, 255; 361/748, 752, 757, 807; 257/678, 777, 778, 783, 787, 788, 790

(56) References Cited

U.S. PATENT DOCUMENTS

| | | | | |
|---|---|---|---|---|
| 4,910,232 A | * | 3/1990 | Arai | 522/33 |
| 5,386,342 A | * | 1/1995 | Rostoker | 361/749 |
| 5,828,126 A | * | 10/1998 | Thomas | 257/695 |
| 6,118,080 A | * | 9/2000 | Jiang et al. | 174/253 |
| 6,127,833 A | * | 10/2000 | Wu et al. | 324/755 |
| 6,218,215 B1 | * | 4/2001 | Distefano et al. | 438/108 |

* cited by examiner

*Primary Examiner*—Dean A. Reichard
*Assistant Examiner*—W. David Walkenhorst
(74) *Attorney, Agent, or Firm*—Lorusso, Loud & Kelly

(57) ABSTRACT

The present invention protects a thin wire connection from oscillation of a resin protecting an electronic circuit module from vibration, impact, and corrosion. An electronic control unit including an electronic circuit module in which a bare chip is mounted on a circuit board and a case for housing the module, is provided, wherein the case is filled with a potting gel to protect the module. The bare chip, including its wire connection to the circuit board, is sealed in advance with a gelatinous resin having thixotropy prior to hardening. The gelatinous substance cures to form a hardened inner layer which has a penetration that is lower than that of the filled potting gel after hardening, and functions to eliminate or substantially reduce the affect of viscoelastic oscillation of the outer layer on the bare chip and the wire connection.

5 Claims, 2 Drawing Sheets

ELECTRONIC CONTROL UNIT

CROSS-REFERENCE TO RELATED APPLICATION

This application claims, under 35 USC 119, priority of Japanese Application No. 2000-391552 filed Dec. 22, 2000.

BACKGROUND OF THE INVENTION

1. Field of the Invention

The present invention relates generally to an electronic control unit, and more particularly to the protection of a module housed in an electronic control unit.

2. Description of Related Art

A circuit module used as an electronic control unit generally comprises circuit chips having different functions, such as an integrated circuit (IC), a high density integrated circuit (LSI), and a microcomputer and the like, attached by die bonding or the like to a circuit board upon which an electric circuit pattern has been printed, and is connected to the wiling on the circuit board by wire bonding or soldering. As circuit chips, both a packaged chip which is covered by a package made of plastic or the like and sealed with a junction coating resin, and a bare chip having no such sealing are used. In a packaged chip, an electrode pad and a lead of the package are connected by wire bonding while the lead and the wiring of the circuit board are connected by soldering. In a bare chip, however, the electrode pad and the wiling of the circuit board are directly connected by wire bonding.

When the above circuit module is used under conditions in which it is exposed to high temperature or large amounts of vibration or shock, such as in an electronic control unit housed in an engine room of a vehicle, it is necessary to take some precaution to ensure the protection of the circuit module against corrosion, shock, and impact. In one such measure for protection of circuit modules, in which both the bare chip and packaged chip types are used together to form an electric circuit, the bare chip on the circuit board is surrounded by a frame into which a gelatinous silicone or epoxy resin or the like is then filled to a certain height so as to cover the bare chip. An example of this type of circuit module is disclosed in Japanese Patent Application Laid-open Publication ("Kokai") No. 10-303232.

Protecting only the bare chip portion in this way, however, is not always sufficient for use under extreme conditions such as those mentioned above. One conceivable measure for improving shock and impact resistance is to surround not only the bare chip portion but the entire circuit module with a viscoelastic potting gel that absorbs vibration and impact, in which case, the entire electronic control unit case which houses the circuit module would be filled with the potting gel. However, if the entire housing (ECU case) is filled with potting gel, because the wires connected to the bare chip portion are thin, there is the possibility that they may become disconnected by the increase in load on the connections due to viscoelastic vibration of the potting gel. Moreover, because filling with the potting gel is the last step after incorporating the circuit module into the case and wire bonding it to a connector portion mounted to the case, the bare chip is not protected while the circuit module is handled until the last step.

SUMMARY OF THE INVENTION

It is therefore a first object of the present invention to provide an electronic control unit in which a bare chip of the circuit module is sealed by a simple method.

It is another object of the present invention to fill an entire case, housing a circuit module, with potting gel and to provide an electronic control unit wherein there is no oscillation of wiring of the bare chip by the gelatinous substance even if there is a large impact or vibration.

In order to achieve the foregoing objects, in one aspect the present invention provides an electronic control unit comprising an electronic circuit module, in which a bare chip is mounted on a circuit board, and a case for housing the module. The case is filled with a potting gel to protect the module. In advance of the filling with potting gel, the bare chip is sealed with a gelatinous substance which is capable of retaining its own shape, which has thixotropy and which covers wire connections between the bare chip and the circuit board. The gelatinous substance is cured (hardened) and then sealed within the potting gel.

Because a gelatinous substance having a thixotropy is used to seal the bare chip, the bare chip, which has a lower resistance than other portions, is locally protected by a simple step involving only application of a gelatinous substance. Moreover, the fact that the seal assumes a shape on its own due to the thixotropy of the gelatinous substance obviates the need for arranging a frame or the like to shape the seal, as is necessary in the related art. Further, because the seal around the bare chip portion does not require extra space, the circuit board is able to be made smaller, thus enabling costs to be reduced. In addition, by first sealing the bare chip portion in a clean room, it is possible to perform the transfer and assembly steps thereafter in an ordinary environment. This is advantageous for reducing costs due to simplification of the manufacturing line.

In another aspect the present invention provides an electronic control unit comprising an electronic circuit module, in which a bare chip is mounted on a circuit board, and a case for housing the module, in which the case is filled with a potting gel to protect to the module, as in the first embodiment. However, in the second embodiment the bare chip and wire connections between the bare chip and the circuit board, are sealed inside the potting gel, with the cured gelatinous substance which is a hardened inner layer G' having a penetration less than that of the potting gel G. Therefore, even if the potting gel which fills the case vibrates viscoelastically, the vibration is blocked by the gelatinous substance, which has a low penetration, and does not reach the bare chip. As a result, the bare chip, as well as the connections of thin wires, are reliably protected without need for special shielding. Further, because the bare chip is sequentially sealed by first the gelatinous substance and then the potting gel which forms a layer on the outside of the gelatinous substance, heat radiates to the case through these seal layers, enabling the bare chip to be cooled.

In all embodiments, the sealing layer remains gelatinous (unhardened or "semi-solid") in the final product, i.e., after the potting gel has been hardened.

It is preferred that the gelatinous substance be a junction coating resin which, upon curing, has a penetration that becomes less than that of the potting gel with heat-hardening.

Accordingly, a seal is formed around the bare chip with only the smallest possible amount of material due to the thixotropy of the gelatinous substance. This enables the bare chip portion to be reliably sealed using a junction coating resin which has a high cost and which is more reliable than potting gel, while keeping costs down.

DETAILED DESCRIPTION OF PREFERRED EMBODIMENTS

Figure 1:
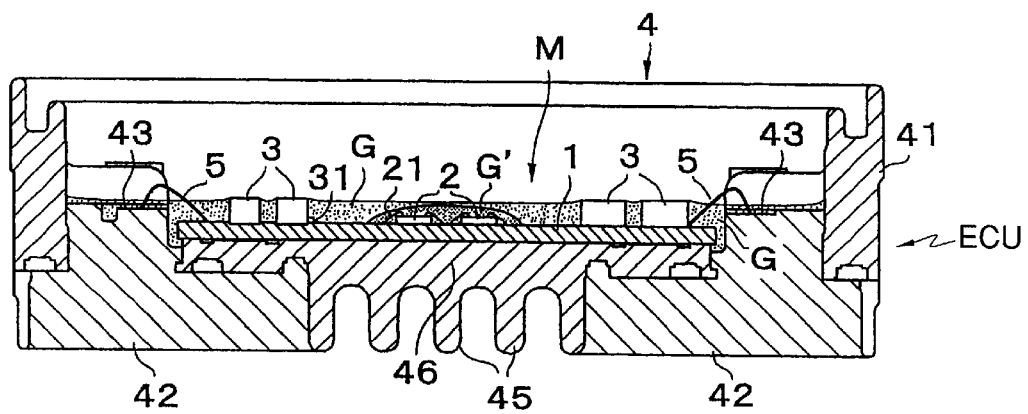
FIG. 1 is a partial sectional view of an electronic control unit of one embodiment according to the present invention.
Figure 2:
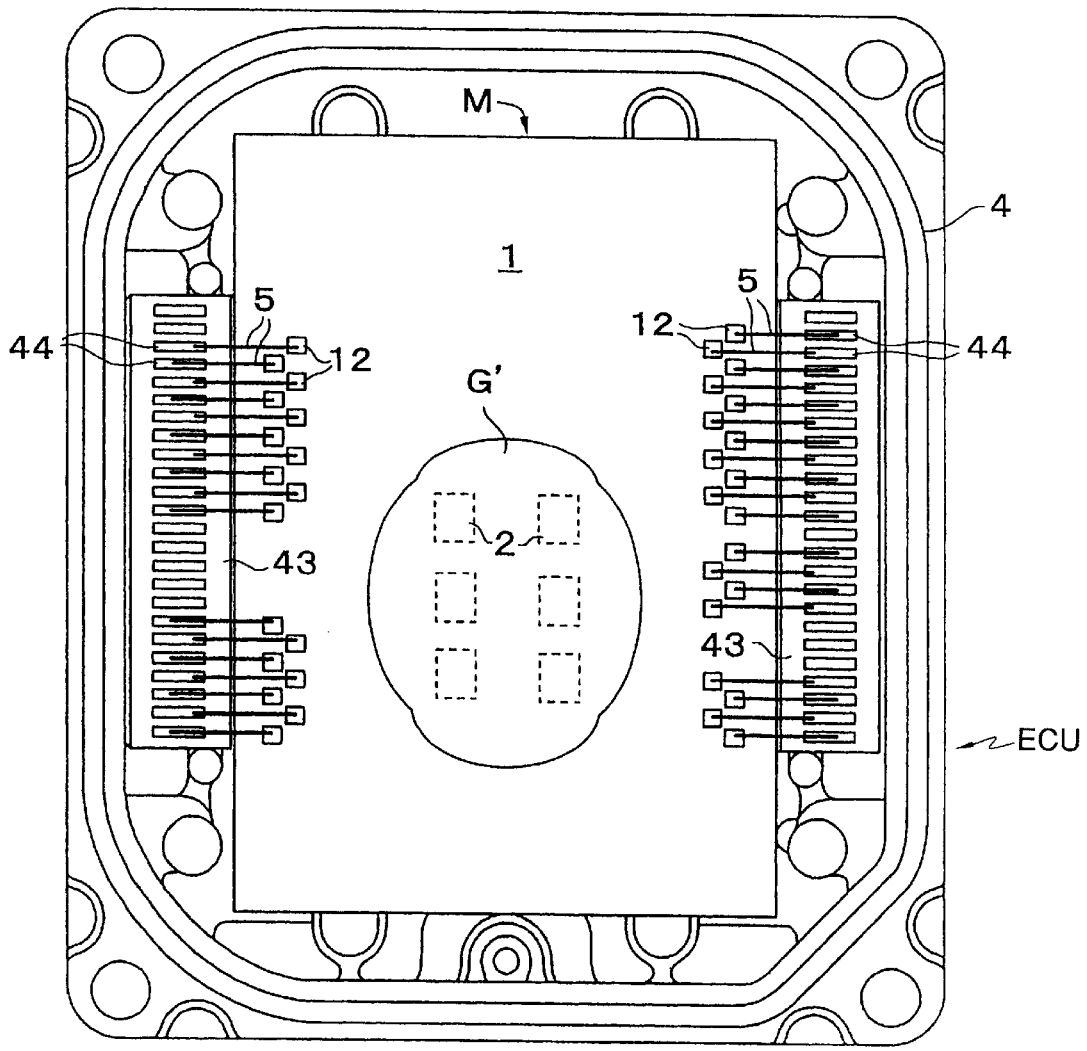
FIG. 2 is a plan view of the electronic control unit of FIG. 1.

A preferred embodiment of the present invention will now be described with reference to FIG. 1, which is a sectional view of the electronic control unit (ECU), and to FIG. 2 which is a plan view of the same unit without the packaged chip shown. This electronic control unit includes an electronic circuit module M, in which a bare chip 2 and a packaged chip 3 which have different functions are mounted on a circuit board 1, and a case 4 which houses the module M. The case 4 is filled with a potting gel G to protect the module M.

According to the present invention, the bare chip 2, including the wire connection to the circuit board 1, is sealed by a gelatinous substance G' which, upon curing, has a penetration lower than that of the potting gel G. Penetration in this case is used to express the hardness of a that is not able to be measured with an ordinary rubber penetrometer due to the fact that the modulus of elasticity is low. "Penetration" has a correlation with the modulus of elasticity, and, as the terminology is used herein, is measured as specified in JIS-K2220 (JIS=Japanese Industrial Standard). The method of JIS-K2220 measures "penetration" in units of ¹⁄₁₀ mm as the insertion length of a cone needle when a ¼ cone needle is inserted into a sample under a total load of 9.38 g. In this embodiment, a junction coating resin having a penetration, that upon curing becomes lower than the potting gel with heat hardening, is used as the gelatinous substance forming inner layer G'. The penetration after heat hardening must be selected according to the placement of the bare chips 2, such as the spacing therebetween, etc., though generally a penetration value of approximately 30 to 40 (¹⁄₁₀ mm) is preferable.

The case 4 is in the shape of a rectangular box with an open top. The interior of the bottom carries the circuit module M and the outside of the bottom is a heat sink 46 with fins 45. The case 4 includes a main body 41 made of die-cast aluminum with openings on both sides for inserting connectors 42. The connectors 42, made of resin, are inserted into the openings in the main body 41 and are fixed by bonding. The case 4 further includes a cover, not shown, for covering the top open portion of the main body 41. In FIG. 1 which shows the case 4 in section, details of the structure of the lower portion of the connectors 42 and the terminals embedded therein are omitted.

The circuit board 1 includes a base of a ceramic material or the like and is of a single- or multi-layered structure on which a conductive circuit pattern has been printed. Chips 2 and 3 are functional elements such as an integrated circuit (IC), a high density integrated circuit (LSI), a microcomputer or the like and are fixed to the circuit board 1 by means such as die bonding. The circuit module M has two chips, including the bare chip 2 which is not sealed and which is connected to the circuit pattern by wire bonding, and a junction coating resin is then applied thereon, thereby creating a seal that assumes its own set shape by the thixotropy of the junction coating resin. The packaged chip 3, on the other hand, is connected by a lead to the wiring in the circuit pattern with solder 31.

The circuit module M is housed in the case 4, with the circuit board 1 of the circuit module M mounted on the heat sink 46 of the bottom of the case main body 41 and fixed by appropriate means such as screws or bonding. With the circuit board 1 inserted into the case 4 and fixed thereto, terminals 12 for sending and receiving various singles, as well as for supplying power, arranged in groups on both sides of the circuit board 1 are connected to exposed portions of the terminals 44 embedded in the connectors 42 through pads 43 that are positioned on opposing sides of the circuit board 1 of the circuit module M.

A heat hardening potting gel G is then filled into the space in the case 4 to protect the circuit module M mounted therein. The gelatinous substance G is filled to a height where, at the very least, a solder connection 31 that joins a functional element 3 mounted on the circuit board 1 (see FIG. 1) and the wiring on the circuit board 1 are covered. The circuit board 1 is lower than the joint of the bonding wire 5 and the terminal 44 on the pad 43. Filling the case 4 with the potting gel G reliably protects the thin wire connection 21, in addition to the bare chip 2, without the need to provide a special shield member because, even if the potting gel G, vibrates viscoelastically, the vibration is blocked by the hardened inner layer G' with a low penetration which seals the bare chip 2 so that the bare chip 2 is not affected.

The circuit module M arranged in the manner described above and sealed with the potting gel G is effectively cooled by allowing heat generated by each of the functional elements 2 and 3 to escape, with the heat from the bare chip 2 escaping through, in sequence, the seal layer of the junction coating resin G' and the potting gel G which forms a layer overlying the junction coating resin G'. Thus, the heat from the packaged chip 3 escapes through the potting gel G. Heat from both the bare chip 2 and the packaged chip 3 also escapes through direct transfer to the circuit board 1 and then to the heat sink 46 of the main body 41 of the case which is in contact with the circuit board 1. The heat received in the heat sink 46 by conduction from the circuit board 1 is then discharged into the atmosphere through heat exchange between the plurality of fins provided on the bottom of the heat sink 46 and the ambient air.

Manufacture of the electronic control unit involves the following steps in a clean room:

(1) mounting an SMD on the circuit board 1, (2) mounting a bare chip 2 on the circuit board 1, (3) connecting the bare chip 2 to the circuit board I by thin wire bonding, (4) sealing the bare chip 2 with a primary gel, i.e., junction coating resin G' (thus completing the module), followed by:

(5) transferring the circuit module M from the clean room, (6) bonding the circuit module M and the connectors 42 to the electronic control unit case 4, (7) connecting the circuit module M and the connectors 42 by wire bonding with thick wire, and (8) sealing the entire circuit module M inside the electronic control unit case 4 with a second gel, i.e., the potting gel.

In the foregoing steps, according to the present invention, the bare chip 2 is first sealed with the junction coating resin G', which is a gelatinous substance capable of retaining its own shape and having thixotropy (thixotropy: exhibiting pseudo high viscosity under a low shear ratio), with the junction coating resin covering the wire connection 21 between the bare chip 2 and the circuit board 1 thereof. Thixotropy can be expressed quantitatively as a thixotropy ratio. The thixotropy ratio should be selected in accordance with the circuit construction such as the area, height, arrangement, spacing and placement of the bare chips 2. By sealing the bare chips 2 in this manner with a gel having thixotropy (and low fluidity), the area around the bare chips 2 can be locally sealed without the need for using a frame such as a flow stopper because the gelatinous substance does not flow.

In Step (8), the final step, the entire circuit, including the packaged chip 3 is sealed by filling the case 4 with potting gel G, which has a low viscosity prior to hardening, so that it flows over the entire circuit board 1 and covers the previously sealed portion of the bare chip 2. Accordingly, vibration of the junction coating gel G' resulting from dropping or vibration of the electronic control unit is reduced, in turn reducing the affect on the bare chip 2 portion without the need to provide a frame to prevent the gel from flowing, as mentioned above, because the penetration around the bare chip 2 is low after both of the gels have hardened.

Figure 3:
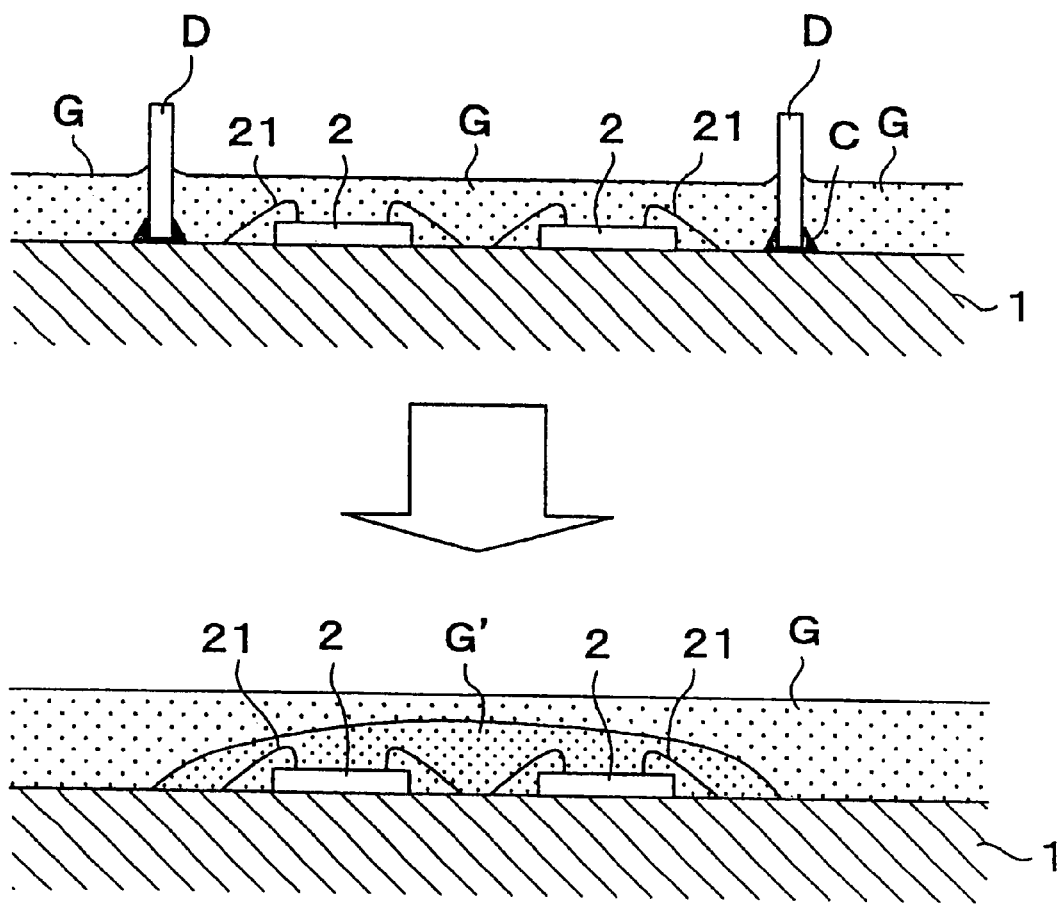
FIG. 3 is a partial sectional view showing the difference between the structure of a bare chip seal in an electronic control unit and the structure of a seal in accordance with the related art.

FIG. 3 are sectional views comparing a seal structure provided with a frame to prevent the gel from flowing and a seal structure using a thixotropic gel in accordance with the present invention. The frame D encloses both the bare chips 2 and the wire connections 21. With the structure having a frame to prevent the gel from flowing, shown in the top portion of the figure, space is required for accommodating the thickness of frame D and a bonding adhesive C is required for bonding the frame D to the circuit board 1 on both sides of the frame D. With the structure of the present invention shown in the bottom portion of FIG. 3, on the other hand, no such space is required because the gelatinous substance G' settles in shape on its own with its own thixotropy functioning as a flow stopper. Further, because the present invention allows the frame D to be omitted, it offers the advantage of compactness and cost reduction of the electronic control unit because space in the circuit board area is able to be reduced.

Moreover, in the present embodiment, because the penetration of the gelatinous substance G' upon hardening becomes lower than that of the potting gel G after hardening, even if the potting gel G, which forms the outside layer, oscillates due to dropping or vibration of the electronic control unit, that oscillation is not transferred to the hardened substance G' which forms the inner layer. This reduces the effect from the oscillation on the bare chips 2 and the wire connections thereto which are sealed with the hardened inner layer G' which is formed from the gelatinous substance. Accordingly, this protective function is equally effective without need for a frame to prevent the gel from flowing.

Above has been described an embodiment of the present invention. The example given in the embodiment is for the purpose of understanding the invention. Accordingly, the invention is intended to embrace all such alternatives, modifications, and variations that fall within the spirit and broad scope of the appended claims.

The teachings of Japanese Application No. 2000-391552, filed Dec. 22, 2000 are incorporated herein in their entirety, inclusive of the specification, claims and drawings.

What is claimed is:

1. An electronic control unit including an electronic circuit module, said electronic circuit module comprising:
    a circuit board;
    a bare chip mounted on said circuit board;
    a hardened gelatinous resin forming a sealing layer covering said bare chip and a wire connection between the bare chip and the circuit board;
    a case housing the module; and
    a hardened potting gel covering at least said sealing layer, said sealing layer having a penetration less than that of said potting gel.

2. An electronic control unit according to claim 1, wherein the gelatinous resin is a junction coating resin having a penetration that becomes less than that of the potting gel with heat-hardening.

3. An electronic control unit according to claim 1 wherein said potting gel completely fills said case.

4. A method of protecting a bare chip mounted on a circuit board of an electronic circuit module:
    covering the bare chip and a wire connection between the bare chip and the circuit board with a sealing layer of a gelatinous thixotropic resin;
    filling a potting gel into a case containing the electronic circuit module, covering the sealing layer with the potting gel; and
    heating to harden the potting gel and the sealing layer and to produce a cured sealing layer having a penetration lower than that of the hardened potting gel.

5. A method according to claim 4 wherein said filling completely fills the case with the potting gel.

* * * * *

UNITED STATES PATENT AND TRADEMARK OFFICE
CERTIFICATE OF CORRECTION

PATENT NO. : 6,605,779 B2
DATED : August 12, 2003
INVENTOR(S) : Takata et al.

It is certified that error appears in the above-identified patent and that said Letters Patent is hereby corrected as shown below:

Column 1,
Lines 21 and 29, "wiling" should read -- wiring --.

Column 4,
Line 48, "board I" should read -- board 1 --.

Signed and Sealed this

Thirteenth Day of April, 2004

JON W. DUDAS
*Acting Director of the United States Patent and Trademark Office*